(12) United States Patent
Yusa et al.

(10) Patent No.: US 7,670,922 B2
(45) Date of Patent: Mar. 2, 2010

(54) METHOD OF MEASURING ALIGNMENT OF MEASUREMENT PATTERN

(75) Inventors: Hiroyuki Yusa, Miyagi (JP); Azusa Yanagisawa, Miyagi (JP); Toshifumi Kikuchi, Miyagi (JP); Akihiro Makiuchi, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 688 days.

(21) Appl. No.: 11/481,059

(22) Filed: Jul. 6, 2006

(65) Prior Publication Data

US 2007/0004059 A1    Jan. 4, 2007

Related U.S. Application Data

(63) Continuation of application No. 10/351,418, filed on Jan. 27, 2003, now abandoned.

(30) Foreign Application Priority Data

Jan. 31, 2002    (JP)    ............................. 2002-023278

(51) Int. Cl.
*H01L 23/544* (2006.01)

(52) U.S. Cl. ................ 438/401; 257/797; 257/E23.179
(58) Field of Classification Search ................ 257/797, 257/E23.179; 438/401, 551
See application file for complete search history.

(56) References Cited

U.S. PATENT DOCUMENTS

| 5,969,807 | A | * | 10/1999 | Levinson et al. ............ 356/124 |
| 6,319,791 | B1 | * | 11/2001 | Ando ......................... 438/401 |
| 2002/0086549 | A1 | * | 7/2002 | Minami et al. .............. 438/737 |
| 2003/0174879 | A1 | * | 9/2003 | Chen ......................... 382/151 |

* cited by examiner

*Primary Examiner*—Wael Fahmy
*Assistant Examiner*—Abul Kalam
(74) *Attorney, Agent, or Firm*—Kubotera & Associates, LLC

(57) ABSTRACT

A resist pattern for alignment measurement being shrunk by a heat flow includes a plurality of positive type or negative type line patterns. Widths of spaces between the line patterns are greater than twice those of the line patterns. Alternatively, the resist pattern comprises a box-shaped or slit-shaped measurement pattern and a pair of box-shaped or slit-shaped auxiliary patterns provided inside and outside the measurement pattern, respectively.

11 Claims, 11 Drawing Sheets

METHOD OF MEASURING ALIGNMENT OF MEASUREMENT PATTERN

CROSS-REFERENCE TO RELATED APPLICATIONS

This is a continuation application of the prior application Ser. No. 10/351,418 filed Jan. 27, 2003 now abandoned.

BACKGROUND OF THE INVENTION

1. Field of the Invention

The present invention relates to a method of measuring alignment of a measurement pattern used for manufacturing a semiconductor device and, especially, to a method of measuring alignment of a measurement pattern relative to a pattern formed in a preceding process after a resist pattern is formed for photolithography.

2. Description of the Related Art

FIG. 8 shows the principal of alignment measurement according to the conventional method. In FIG. 8, appropriate regions are selected from a preceding pattern 10 formed in the preceding process, for example, a box-shaped pattern 10 and a present pattern 100 being processed at present, for example, a box-shaped pattern 100, so that symmetric waveforms are obtained from the regions by the waveform treatment. The waveforms of the patterns 10 and 100 are recognized or detected and graphically treated for linear approximation to obtain the peak points of the preceding and present processes or steps. That is, a resist pattern for alignment measurement comprises the preceding box pattern 10 provided at an outermost position and the present box pattern 100 provided inside the box pattern 10 with a predetermined space.

Pattern recognition elements, for example, photo-sensors 100-104 are arranged along a section A-A', which is selected as an appropriate region to obtain symmetric waveforms of the positive type box patterns of the preceding and present processes. The waveform signals of line patterns at the section A-A' are treated to obtain a characteristic B1-B1'. The characteristic B-B' is treated in an alignment measuring apparatus to obtain a characteristic B2-B2'. That is, the line pattern containing edges 10-1 and 10-2 becomes the characteristic B1-B1' containing points 10-3, 10-4, and 10-5 as a result of the treatment of the waveform signals and then, becomes the characteristic B2-B2' containing points 10-6, 10-7, and 10-8 as a result of the waveform treatment in the alignment measuring apparatus.

Consequently, the line pattern containing the edges 10-1 and 10-2 is characterized in that the concentration value thereof increases linearly up to the point 10-8 from the edge points 10-6 and 10-7. The point 10-8 represents the central concentration value of the line pattern. The center of the characteristic pattern obtained by the waveform treatment of the line pattern, such as the point 10-8, is referred to as a "central point".

In the same way, the box pattern 100 containing edges 100-1 and 100-2 is changed to the characteristic B1-B1' containing points 100-3 and 100-4 by the waveform treatment at the section A-A' and then, changed to the characteristic B2-B2' containing points 100-5 and 100-6 by the waveform treatment in the alignment measuring apparatus. That is, the edge 100-1 becomes the point 100-5 as a result of the waveform treatment at the section A-A'.

The alignment measurement is performed by measuring at least one place, such as an interval between the points 10-8 and 100-5. In FIG. 8, two intervals are measured as shown by arrows Z in the characteristic B2-B2'. It is possible to select any place for X-direction and Y-direction measurements as long as symmetric waveforms are obtained. It is not necessary to measure in both the X and Y directions at each measurement place and any combination of the X and Y direction measurements at different places is acceptable.

As a microscopic pattern is developed, a resist pattern (hole pattern) produced by the ordinary KrF exposure/development method is subject to a baking process of high temperature to generate a heat flow in the resist pattern so that the internal diameter of the hole pattern is reduced when the resist pattern is shrunk by the heat flow.

FIG. 10 shows the principal of pattern shrinkage by the heat flow according to the conventional method. A hole H having a circular section is provided in a resist pattern. The hole H before the heat flow shown on the left-hand side becomes a hole H' shown on the right-hand side after the heat flow. An internal diameter a of the hole H is reduced by the heat flow to an internal diameter a' of the hole H'. This method makes it possible to manufacture a pattern of 0.10 μm or less, which is higher than the resolution limit by the KrF exposure technology.

The method of reducing the hole diameter by the heat flow, however, has the following problems.

(1) If the resist pattern has a very large dimension before the heat flow, for example, if the hole internal diameter is 0.5 μm or more, the resist pattern deteriorates. That is, since the thickness of a resist film is substantially constant, the thickness b of the film at a linear section is reduced due to the increased amount of resist flown in the hole when the hole internal diameter is larger than a certain value, thus causing adverse effects on the etching process after the photolithography.

(2) How the pattern or hole is shrunk is dependent on other holes exist on the left and right-hand sides of the hole. That is, the form of the shrinkage by the heat flow is varies with the amount of the resist flown in the periphery of the hole. Where the holes exist densely, the resist amount per hole is small, which reduces the shrinkage of the pattern. This mechanism is described with aspect to FIG. 11.

FIG. 11 shows the symmetric character of the heat flow according to the prior art. A resist pattern having holes provided at the same interval and having the same diameter is heat-shrunk as described below. A hole A is uniformly shrunk on the upper, lower, and right sides because of the presence of other holes, while the hole A is shrunk to a larger extent on the left side because of the larger amount of resist flow-in due to absence of other holes. Accordingly, the center of the hole A moves to the side of a hole B after the heat flow.

The hole B is uniformly shrunk on every side because of the presence of other holes. A hole C is uniformly shrunk on the upper, lower, and left sides because of the presence of other holes, while the hole C is shrunk to a larger extent on the right side because of larger amount of flow-in resist due to absence of other holes. Consequently, the center of the hole C moves to the side of the hole B after the heat flow.

(3) A fine hole is not sufficiently shrunk unless the width of a space between resist holes is greater than twice that of the resist holes before the heat flow. It is proved from the above-mentioned fact that unless holes are spaced from each other to a certain extent, the holes are not sufficiently shrunk and the sufficient height of the linear section of the resist is not obtained due to a small amount of flow-in resist. Also, experiments show that desired characteristics are obtained when the width of a space between holes is greater than twice that of the holes.

The results of the experiments are as follows:

(1) Object of the Experiments

To measure the conditions under which the thickness b of the linear section in FIG. 10 becomes sufficiently practical after the heat flow.

(2) Conditions

| | |
|---|---|
| Resist: TDUR-P015 | film thickness of 10,000 Å |
| Reflection preventive film (bark material): SWK-EX2 | Film thickness of 1,100 Å |
| NSG film | film thickness of 10,000 Å |
| Wafer: Si-substrate | |
| Exposure energy | 85 mj |
| Manufacturing method | heat shrinkage |

(3) Layer Structure

TDUR-P015/SWK-EX2/NSG film/Si-substrate (4) Results

When the hole diameter of a resist mask is fixed at 0.26 μm, the samples having a hole pitch of 0.52 μm or more satisfied the above conditions. The samples having a hole pitch of 0.78 μm or 1.04 μm also satisfied the above conditions.

(4) Also, a large resist pattern, such as a pattern for alignment measurement, loses the linearity of pattern edges after the heat flow. That is, every resist pattern in a wafer is shrunk as shown in FIG. 10 regardless of the pattern size thereof since the heat flow is produced in the entire wafer. The pattern for alignment measurement requires a relatively large size because the alignment measurement is optically performed. For a large pattern, as shown in FIG. 11, the amount of flow-in resist varies with the position thereof. For example, in the present pattern 100 in FIG. 9, the central portion of each side thereof undergoes the largest drift because of the largest amount of flow-out resist. Consequently, each side of the pattern is curved.

FIG. 9 shows a resist pattern for alignment measurement after the heat flow according to the prior art. Unlike the box pattern 100 in FIG. 8, the present box pattern 100 is shrunk, when the heat flow treatment is applied. When the resist pattern after the heat flow is subject to the alignment measurement, the waveforms of preceding pattern or box 10 and the present pattern or box 100 are processed to obtain the central points of the patterns.

More specifically, the preceding box pattern 10 is provided at the outermost side, and the present box pattern 100 is provided inside the box pattern 10 at a predetermined interval. The photo-sensors 101-104 for pattern recognition are arranged along the section A-A'. The line patterns of the preceding positive type box pattern and a plurality of the present positive type patterns at the section A-A' are processed to obtain the characteristic B1-B1', which in turn is processed in an alignment measuring apparatus to obtain the characteristic B2-B2'.

That is, the line pattern containing edges 10-1 and 10-2 becomes the characteristic B1-B1' containing points 10-3, 10-4, and 10-5 as a result of the process of the waveform signal, and then, the characteristic B-B' is turned to the characteristic B2-B2' containing points 10-6, 10-7, and 10-8 by the waveform-treatment in the alignment measuring apparatus. Consequently, the line pattern at the section A-A' has the characteristic that the concentration value increases linearly up to the point 10-8 from the edge points 10-6 and 10-7. The point 10-8 represents the central concentration value of the center of the line pattern.

As shown in FIG. 9, the resist pattern or box is shrunk by the heat flow caused by a high temperature baking process so that the linearity of the pattern edges is not maintained. That is, the sides of the box pattern under measurement are curved, forming arcs 120. Curved edges 120-1 and 120-2 of the box pattern 100 are turned to points 120-3 and 120-4 in the characteristic B1-B1' by the waveform treatment at the section A-A', and then, turned to points 120-5 and 120-6 in the characteristic B2-B2' by the waveform treatment in the alignment measuring apparatus. Consequently, the edge 120-1 becomes the point 120-5. The measurement of an interval between the points 10-8 and 120-5 represents the measurement of the position at which the present box pattern 100 is curved and deformed by the heat flow.

In FIG. 9, a comparison between the characteristic B1-B1' and the characteristic B2-B2' shows that the shrinkage of the resist pattern edge by the heat flow is a real problem. Especially, when the pattern edges are measured on both the left and right-hand sides, an asymmetric waveform signal is produced by the heat flow. When measured, the asymmetric waveform produces a deviation between the measured position and proper position of the central point, thus producing an adverse effect on the value of the alignment measurement.

As described above, the linearity of the present resist pattern is broken by the heat flow. Consequently, the asymmetric waveform signal is processed, thus shifting the central position of the present pattern, causing an error in the alignment measurement.

SUMMARY OF THE INVENTION

Accordingly, it is an object of the invention to provide a method of measuring alignment of a measurement pattern, which maintains the symmetry of a treatment signal of pattern edge sections even after a heat flow process.

According to one aspect of the invention, a method of measuring alignment of a measurement pattern relative to a first pattern formed on a semiconductor substrate in a first pattern forming process, comprises the steps of:

forming a plurality of line patterns including the measurement pattern on the semiconductor substrate and a first auxiliary pattern arranged along the measurement pattern with a first distance therebetween after the first pattern forming process;

applying heat to the measurement pattern and the first auxiliary pattern; and measuring a second distance between the first pattern and the measurement pattern to determine the alignment of the measurement pattern.

In the method, there is provided a resist pattern for alignment measurement, which is shrunk by a heat flow and comprises a plurality of line patterns.

According to an embodiment of the invention, the line patterns are all positive types or negative types.

According to another embodiment of the invention, widths of spaces between the line patterns are greater than twice those of the line patterns.

According to another aspect of the invention, there is provided a resist pattern for alignment measurement, which is shrunk by a heat flow and comprises a measurement pattern and a pair of auxiliary patterns provided inside and outside the measurement pattern, respectively.

According to an embodiment of the invention, the measurement and auxiliary patterns are box-shaped or slit-shaped.

According to another embodiment of the invention, the measurement and auxiliary patterns are all positive types or negative types.

According to still another aspect of the invention, there is provided a resist pattern for alignment measurement, which is shrunk by a heat flow and comprises a measurement pattern and at least one auxiliary pattern provided inside or outside the measurement pattern, wherein widths of spaces between the measurement and auxiliary patterns are equal in vertical and horizontal directions.

According to yet another aspect of the invention, there is provided a resist pattern for alignment measurement, which is shrunk by a heat flow and comprises a box-shaped measurement pattern and an auxiliary pattern provided outside said measurement pattern, wherein widths of spaces between internal edges of the measurement pattern in vertical and horizontal directions and widths of spaces between outer edges of the measurement pattern and inner edges of the auxiliary pattern in vertical and horizontal directions are all equal.

DESCRIPTION OF THE PREFERRED EMBODIMENTS

Embodiments of the invention will now be described with reference to the accompanying drawings.

First Embodiment

Figure 1:
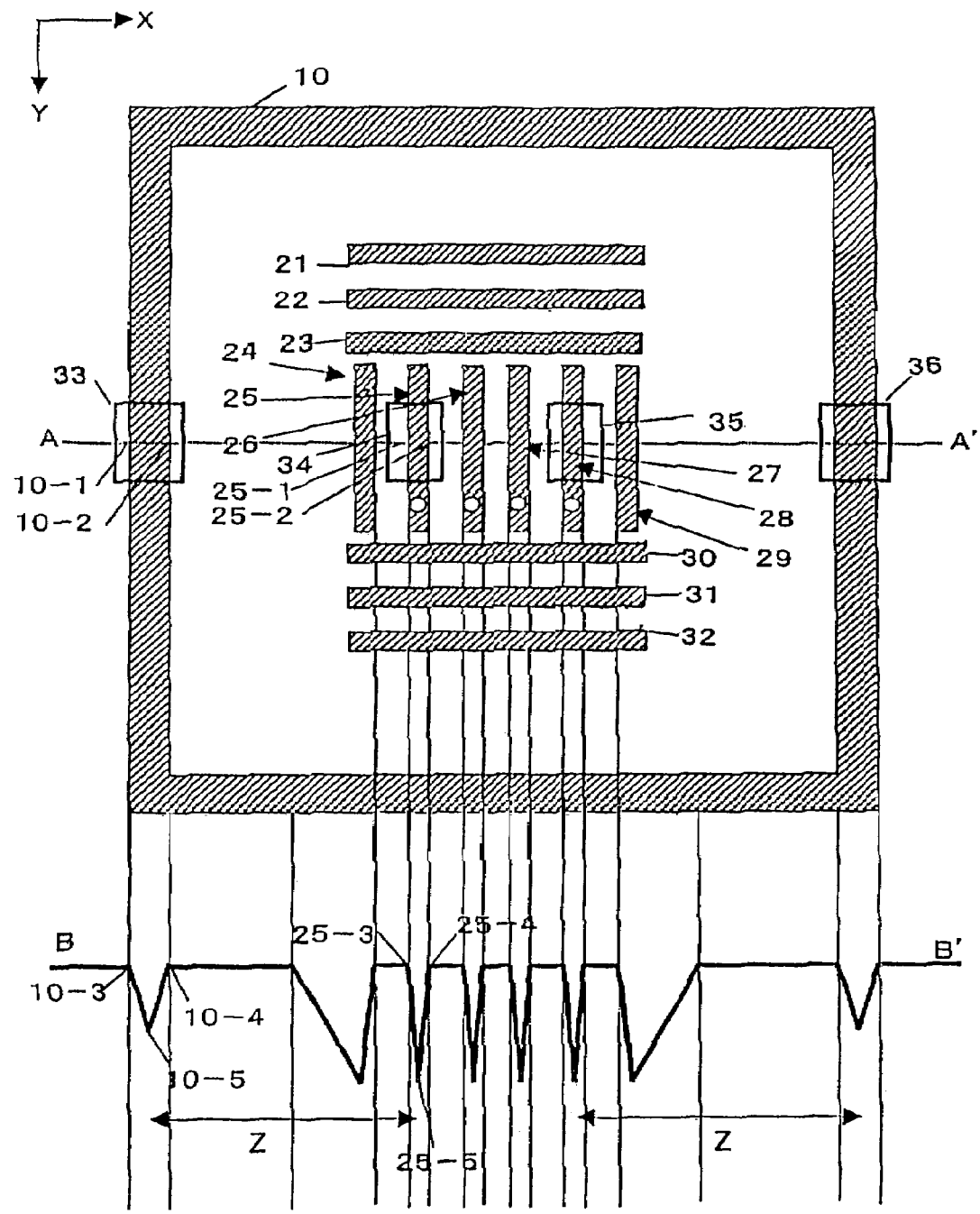
FIG. 1 is a plan view of a resist pattern (positive type) according to the first embodiment of the invention.

FIG. 1 shows a resist pattern (positive type) according to the first embodiment of the invention. A box pattern 10 provided at an outermost position is a resist pattern formed in a preceding process. Edges of a line pattern formed in the preceding process are measured by the pattern measuring device to obtain a picture of the line pattern.

A plurality of patterns in the present process are provided in three rows inside the box pattern 10. In the upper row, there are provided horizontal line patterns 21, 22, and 23 having a predetermined width and length. Spaces between the horizontal line patterns 21-23 have a predetermined width. In the intermediate row, there are provided vertical line patterns 24, 25, 26, 27, 28, and 29, each having a predetermined width and length. Spaces between the vertical line patterns 24-29 have a predetermined width. In the lower row, there are provided horizontal line patterns 30, 31, and 32, each having a predetermined width and length. Spaces between the horizontal line patterns 30-32 have a predetermined width.

A relatively large pattern is required for the optical alignment measurement. Accordingly, the resist pattern according to the first embodiment is made as, for example, a positive type with a pattern size greater than 0.5 μm before the heat flow. The resist pattern comprises at least three lines and spaces of the same size between the lines. It is noted that the pattern size used in the first embodiment is not the pattern size of the hole in the above-mentioned prior art but the pattern size of the line.

The respective spaces have a width greater than twice the line width to obtain a stable resist form after the heat flow. The horizontal line patterns 21, 22, 23, 30, 31, and 32 are provided in parallel to horizontal line sections of the preceding box pattern 10 and subject to the alignment measurement in combination. The vertical line patterns 24-29 are provided in parallel to vertical line sections of the preceding box pattern 10 and subject to the alignment measurement in combination.

The horizontal and vertical line patterns 21, 32, 24, and 29 provided at the outermost positions of each row are not used for the alignment measurement because the positions thereof are prone to the influences of the heat flow. Only the vertical line patterns 25, 26, 27, and 28 having circular marks may be used for measurement because they are symmetric with respect to the section A-A'. In the first embodiment, the vertical line patterns 25 and 28 are used in combination with the vertical line sections of the preceding box pattern 10 for the alignment measurement.

When the vertical section is used instead of the horizontal section A-A', any of the horizontal line patterns 22, 23, 30, and 31 except the outermost horizontal patterns 21 and 32 are used as measurement patterns, and the remaining patterns are used as auxiliary patterns. Widths of the spaces between the vertical and horizontal line patterns are greater than twice those of the line patterns.

In the first embodiment, the pattern measuring elements, such as photo sensors including photo transistors and photo diodes, are arranged on the sectional line A-A' at a predetermined interval. In FIG. 1, two sets of pattern measuring elements 33, 34, 35, and 36 are provided. Picture signals of a line pattern at the section A-A' are obtained by the pattern measuring elements 33, 34, 35, and 36. The picture signals are transformed into the characteristic B-B' by the waveform treatment.

Alignment measuring apparatus (not shown) is furnished with functions of designating a box for the waveform treatment and measuring and treating or processing the picture signals. An example of changing patterns is described below.

Figure 7:
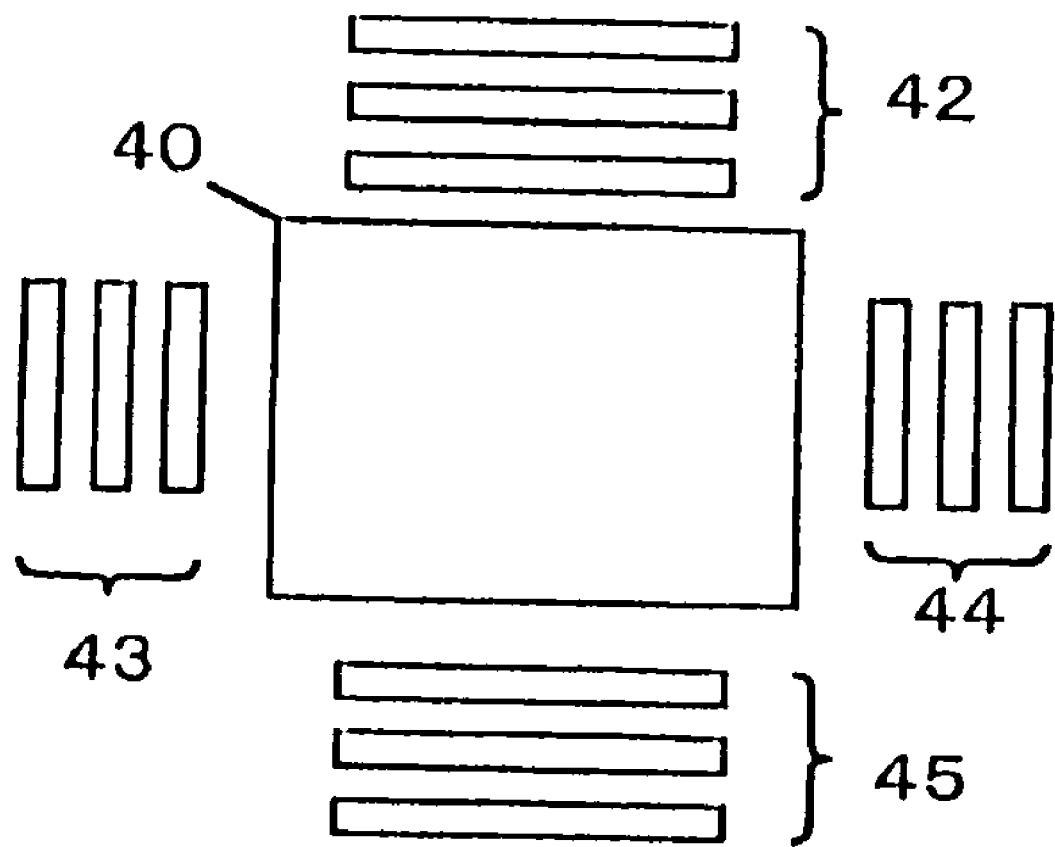
FIG. 7 is a schematic diagram of a present pattern disposed at outer section according to the invention.
Figure 8:
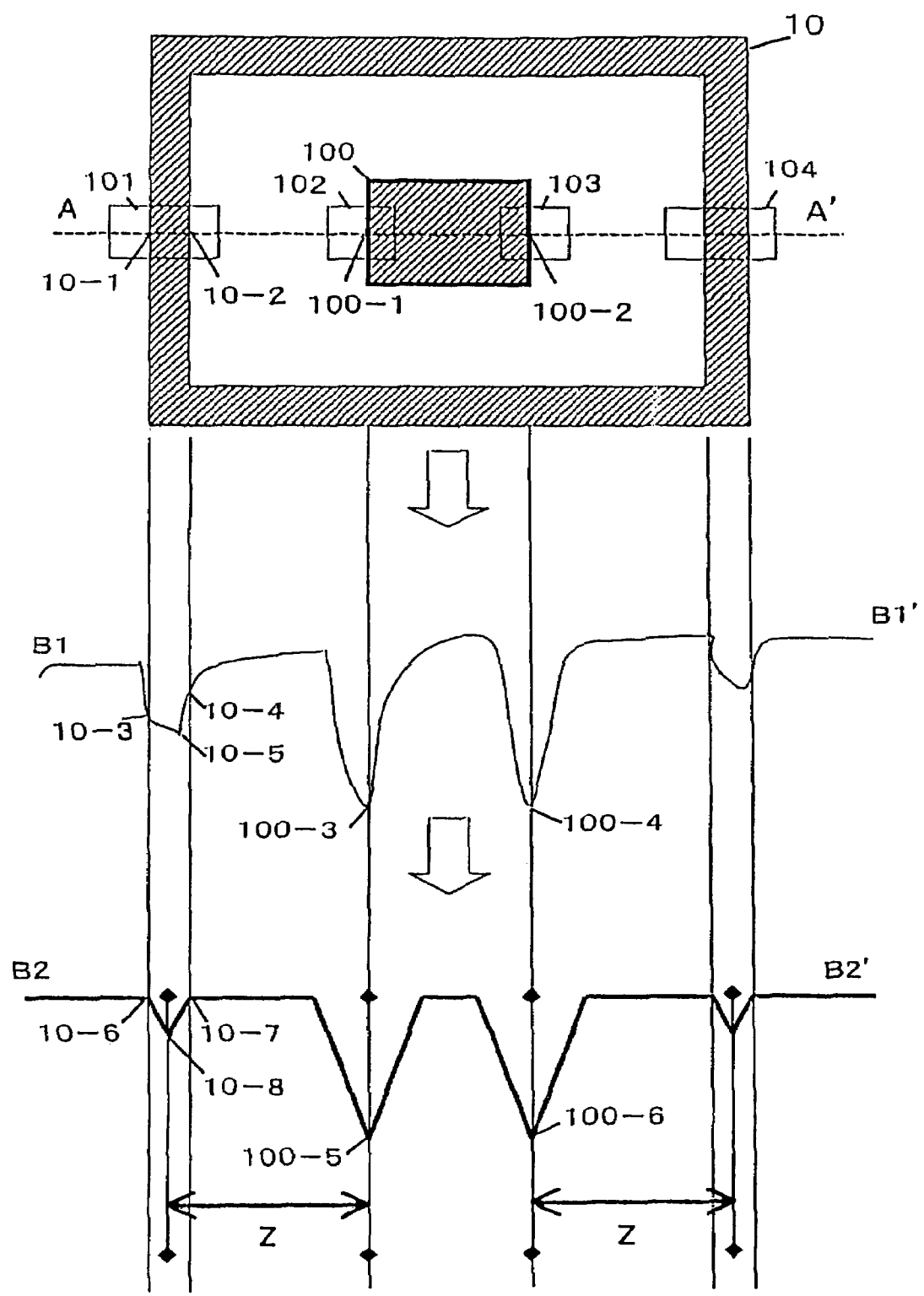
FIG. 8 is a plan view showing a theory of alignment measurement according to the prior art.
Figure 9:
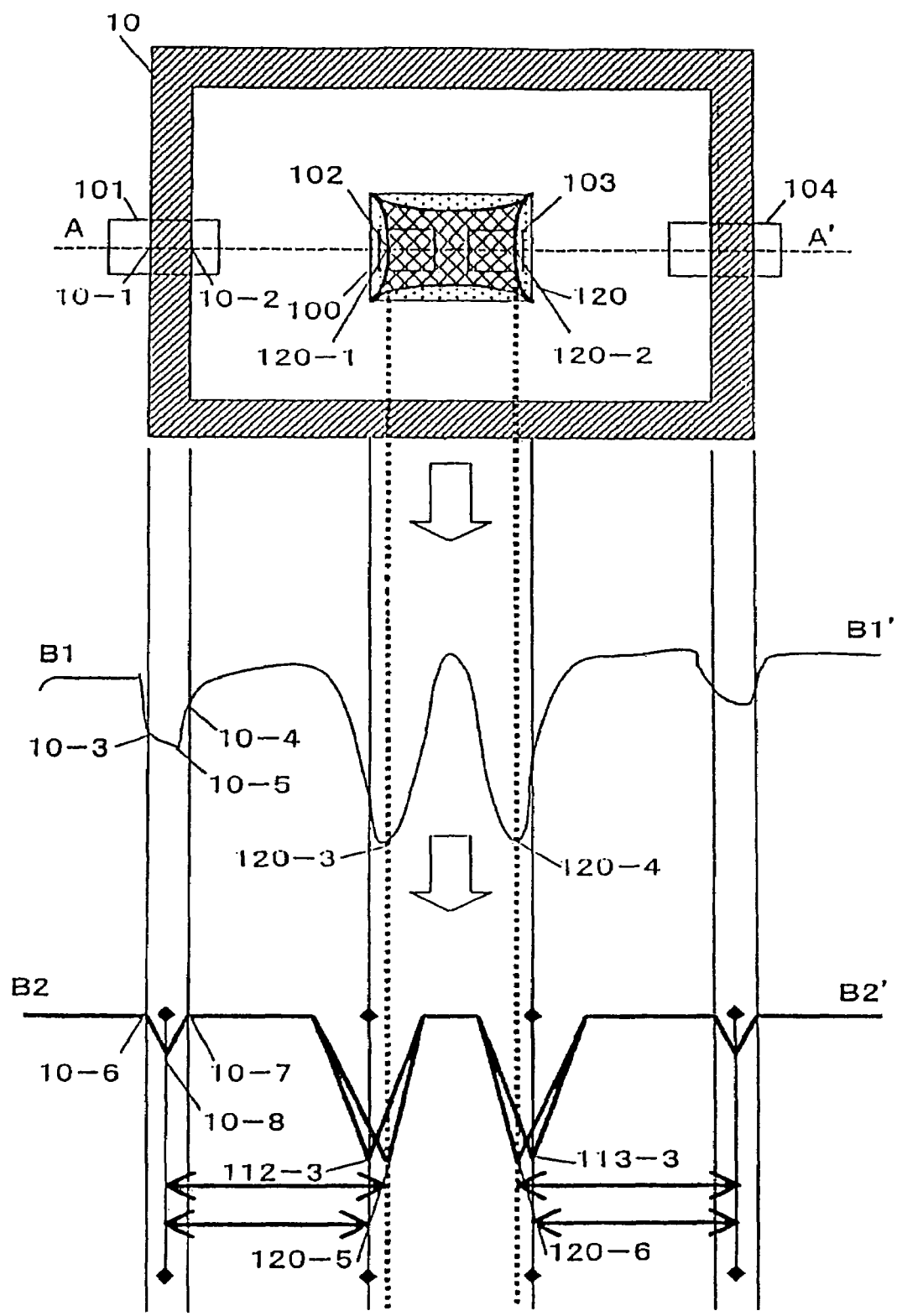
FIG. 9 is a plan view of a resist pattern for alignment measurement after the heat flow according to the prior art.
Figure 10:
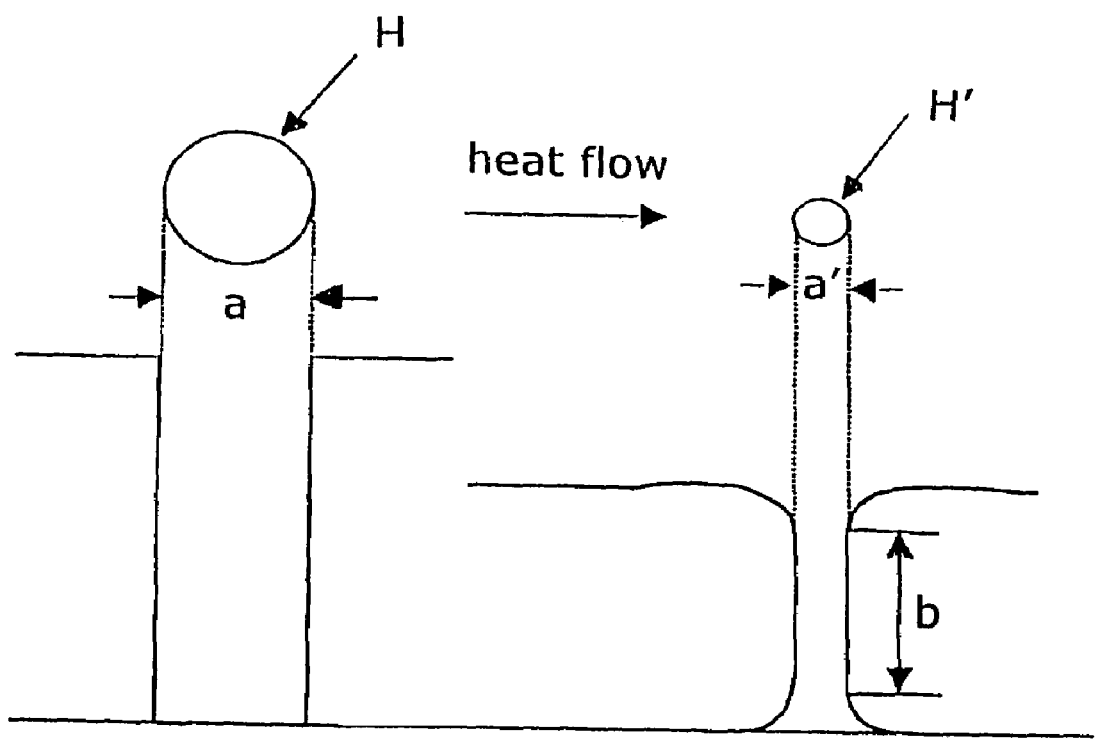
FIG. 10 is a schematic diagram showing a principle of pattern shrinkage by the heat flow according to the prior art.
Figure 11:
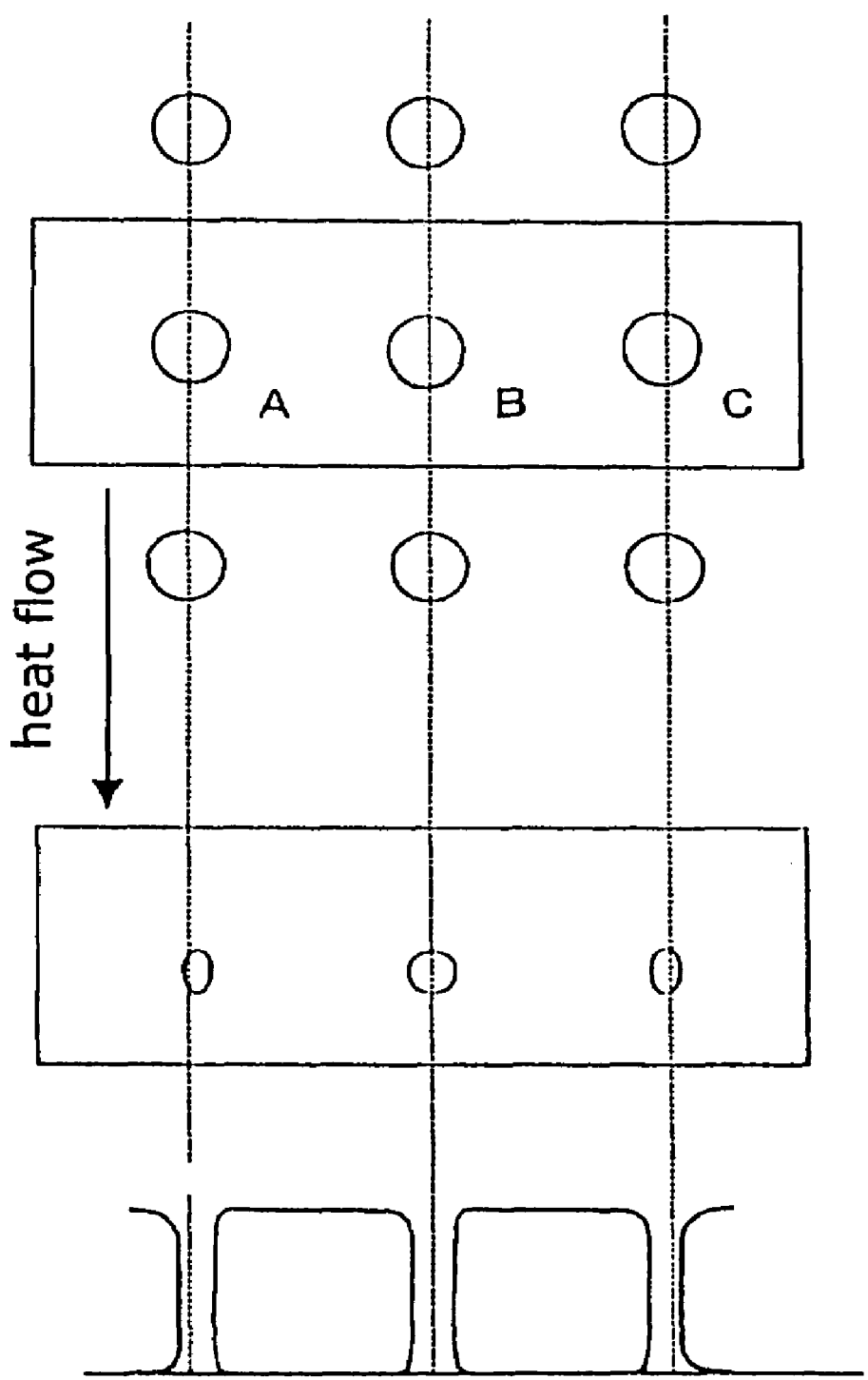
FIG. 11 is a schematic diagram showing asymmetric characteristics made by the heat flow according to the prior art.

FIG. 7 shows an example of disposing the present patterns at outer positions. Four sets of present lines patterns 42, 43, 44, and 45, each including three line patterns, are disposed in parallel to four sides of the preceding box pattern 40. The three line patterns are spaced from each other at a predetermined interval. When the preset patterns are disposed outside the preceding pattern, at least three present patterns are required. The line patterns may be made positive or negative.

The alignment measuring apparatus designates a box to select a region in which a symmetric waveform is obtained so that the waveform is detected. The waveform is subject to linear approximation in the picture-treatment device to obtain peak points of the preceding and present processes for the alignment measurement. Detailed description is as follows.

Figure 3:
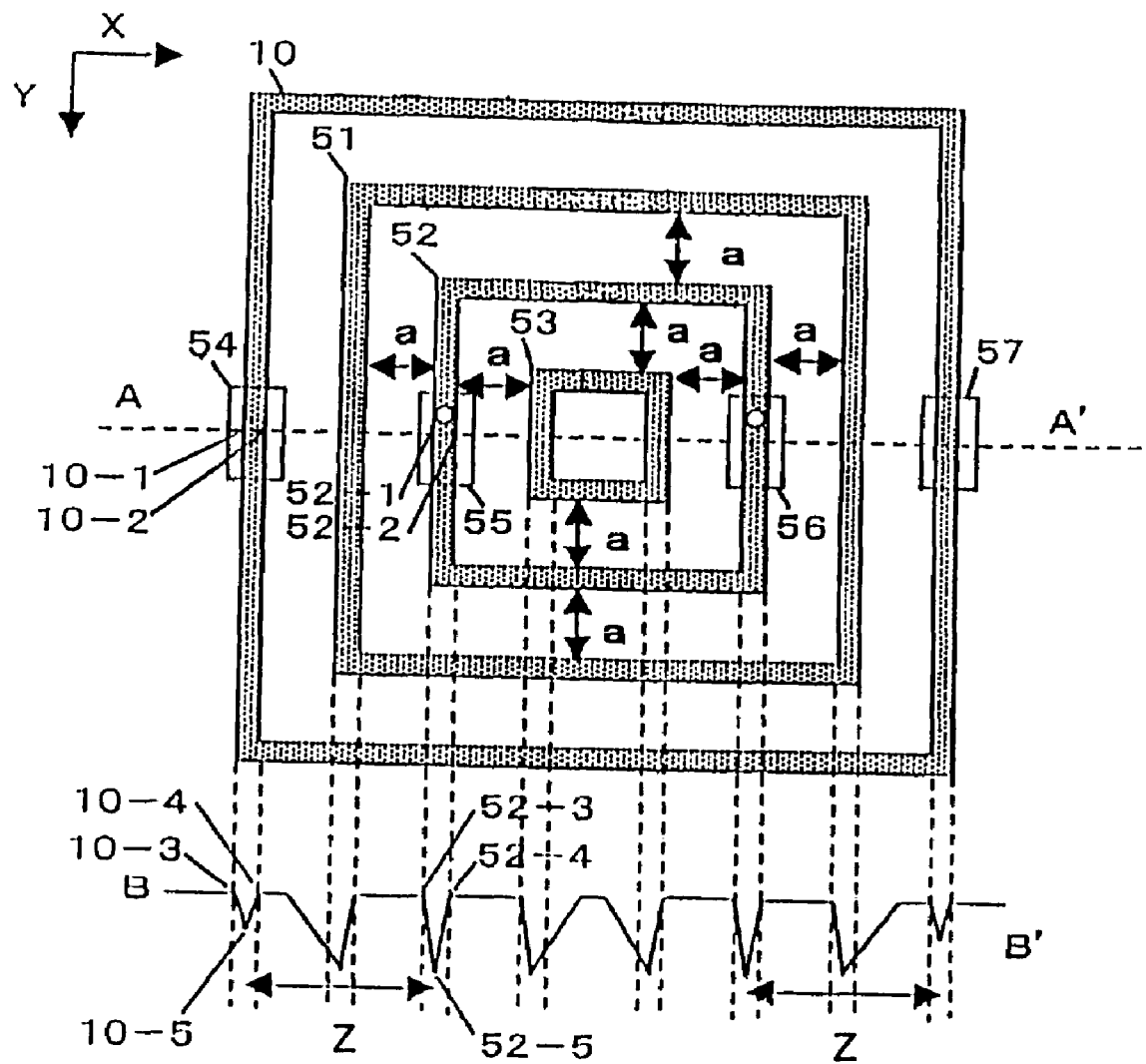
FIG. 3 is a plan view of a resist pattern (positive type) according to the third embodiment of the invention.
Figure 4:
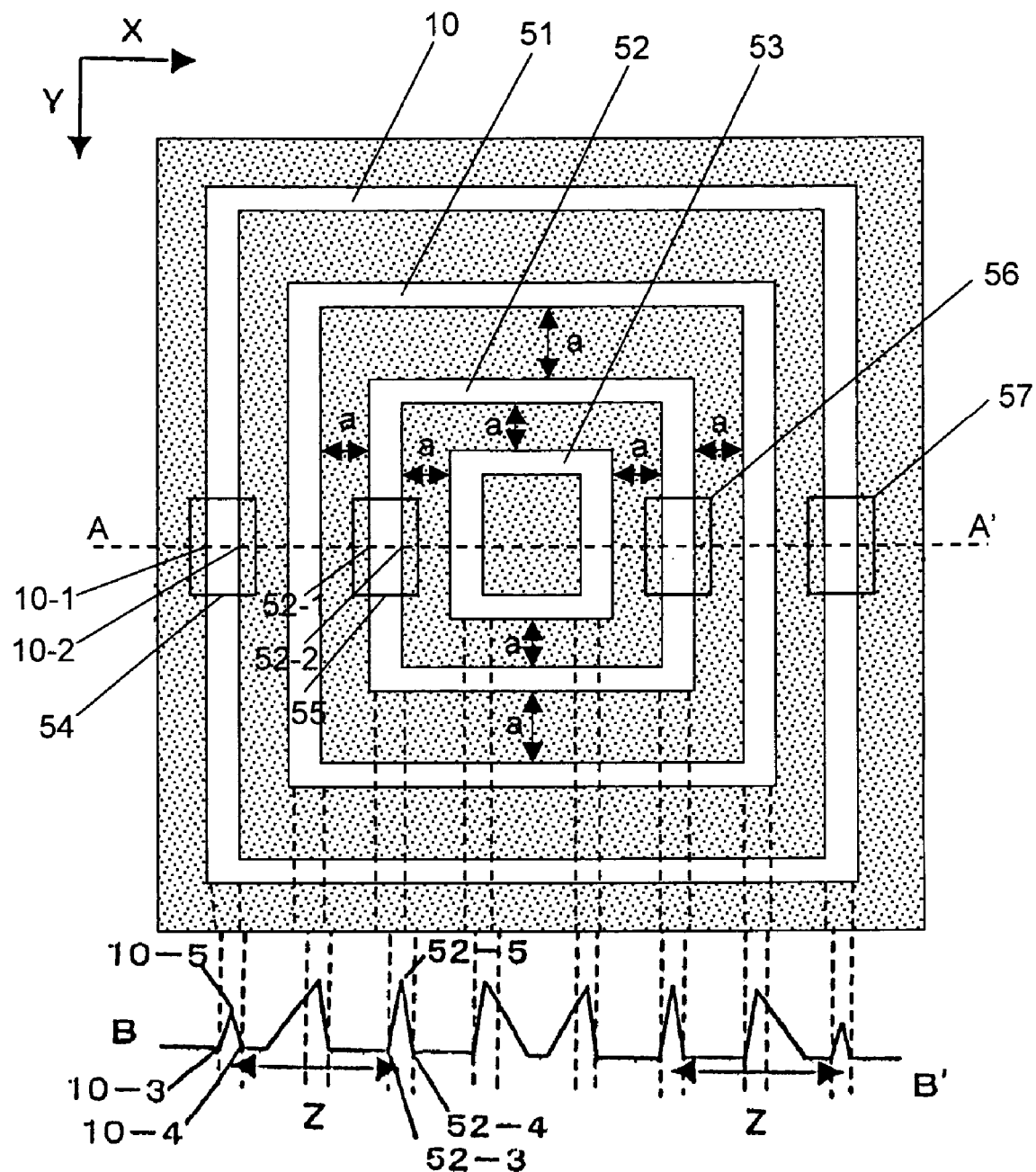
FIG. 4 is a plan view of a resist pattern (negative type) according to the fourth embodiment of the invention.

A plurality of positive type patterns are formed, and edges of line patterns thereof at the section A-A', at which the symmetry is obtained, are measured by the pattern measuring elements to obtain a picture of the line patterns. "The symmetry" means that the line patterns have the same space and the same width on the opposite sides. In FIG. 1, the line patterns are arranged in a symmetric fashion with respect to a central point between the vertical line patterns 26 and 27. Representative examples for the symmetric pattern are shown in FIGS. 3 and 4.

The detected picture of the pattern edges along the line A-A' is changed to the characteristic B-B' as a result of the waveform treatment. In the characteristic B-B', the concentration value is reduced in accordance with the transparent rate of the positive type resist pattern. That is, the edges 10-1 and 10-2 of the line pattern are changed to the points 10-3 and 10-4 in the characteristic B-B', respectively. Consequently, the line pattern at the section A-A' including edges 10-1 and 10-2 has a characteristic that the concentration value is increased linearly up to the point 10-5 from the edge points 10-3 and 10-4 in the characteristic pattern B-B'.

Similarly, the edges 25-1 and 25-2 of the vertical line pattern 25 are changed to the points 25-3 and 25-4 in the characteristic B-B', respectively, as a result of the waveform treatment of the detected picture signal at the section A-A'. The vertical line pattern 25 has a characteristic that the concentration value is increased linearly up to the point 25-5 from the edge points 25-3 and 25-4 in the characteristic pattern B-B'. The points 10-5 and 25-5 represent the concentration values of the central position of the respective line patterns.

Alignment measurement is performed at least at one point. For example, the interval between the points 10-5 and 25-5 is measured. In FIG. 1, two points are measured as shown by the arrows Z. It is not necessary to make both X-direction and Y-direction measurements at one measurement point. Any combination is acceptable. The same measurement is made to patterns in FIG. 7 in which the present pattern is disposed at an outer area. The outermost line patterns are not used for the measurement since they are influenced by the heat flow.

Since the central positions of the edges are accurately measured, the alignment measurement is made accurate. Even when the present patterns are disposed outside the preceding patterns, the same effect as when the present patterns are disposed inside the preceding patterns is obtained if at least three present patterns are provided. The width of the spaces between the lines is greater than twice the width of lines so as to obtain the stable resist form after the heat flow.

Second Embodiment

Figure 2:
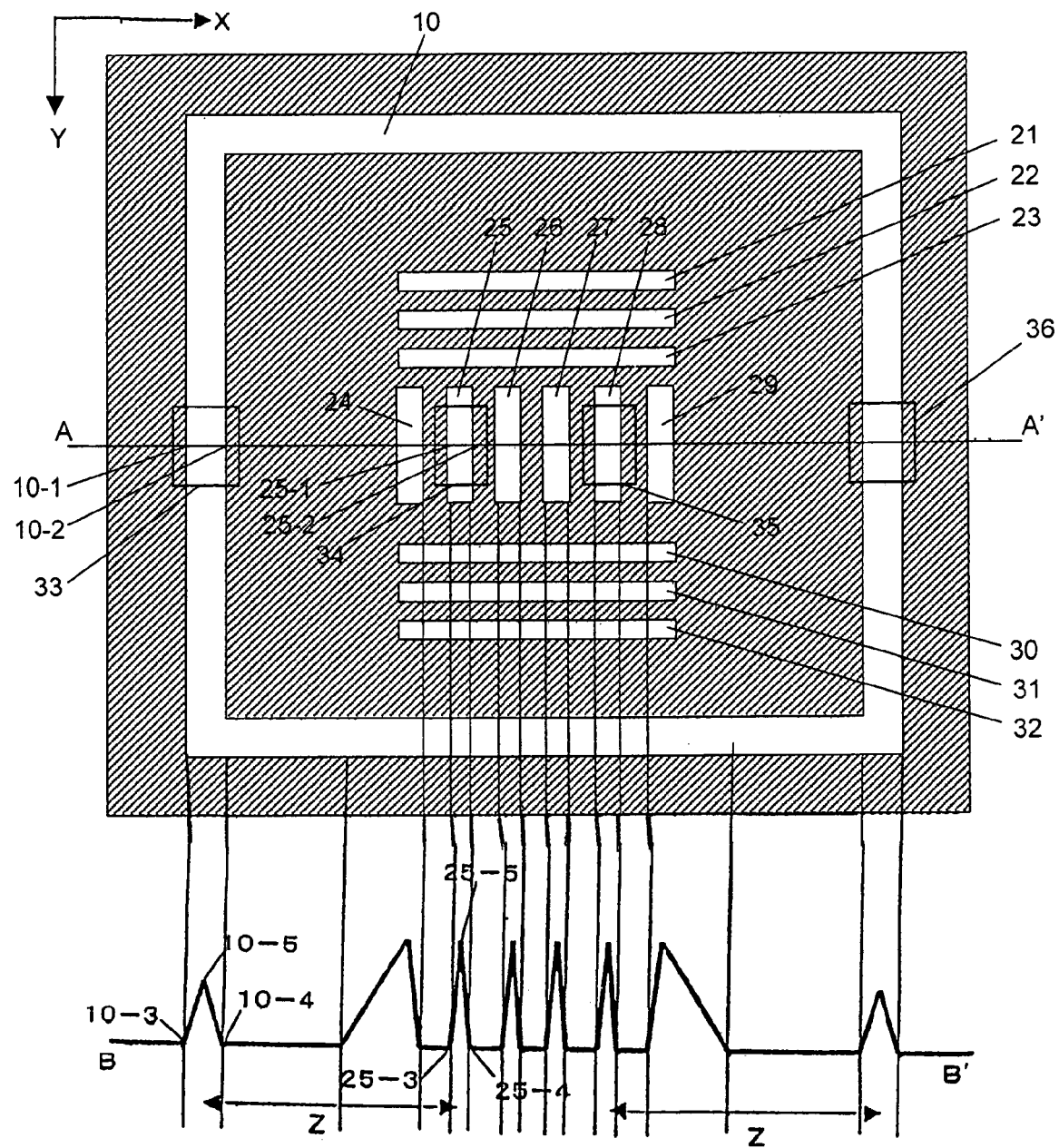
FIG. 2 is a plan view of a resist pattern (negative type) according to the second embodiment of the invention.

FIG. 2 shows a resist pattern (negative type) according to the second embodiment of the invention. The second embodiment employs negative type patterns, while the first embodiment employs positive type patterns. When the waveform treatment of a picture of the negative type patterns at the section A-A' is made, a reverse of the characteristic B-B' of the positive type patterns is obtained. The alignment measurement is performed in the same way. The second embodiment has the same effects as those of the first embodiment.

Third Embodiment

FIG. 3 shows a resist pattern (positive type) according to the third embodiment of the invention. The preceding box pattern 10 is provided at the outermost position. Present box patterns 51, 52, and 53 having similar shapes are disposed inside the box pattern 10 at a predetermined interval. The box patterns 51-53 are spaced from each other at a predetermined distance. The width of spaces is made greater than twice the width of lines on the sides of the box patterns. Auxiliary patterns 51 and 53 are provided inside and outside the measurement pattern 52, respectively. The auxiliary patterns 51 and 53 are made with a pattern size smaller than that of the measurement pattern 52. Spaces between the patterns have a width greater than twice the width of lines of the measurement pattern 52.

The purpose of providing the auxiliary pattern is to adjust the amount of resist which flow in or out so that the alignment measurement of the measurement pattern after the heat flow is made accurate. It is not necessary to take optical date of the auxiliary patterns since the data is not used for the measurement. Even if the auxiliary patterns are buried and disappears after the heat flow, it presents no problem.

The reason that the auxiliary patterns are made with a pattern size smaller than that of the measurement pattern is that if the auxiliary pattern is excessively large, the increased amount of flow-in resist deforms the form of the auxiliary pattern.

Mask size spaces have the same width inside and outside, upper and lower sides, and left and right sides so that the form of the measurement pattern after the heat flow is uniform.

In FIG. 3, photo sensors 54, 55, 56, and 57 for picture detection are arranged along the section A-A'. The measurement pattern 52 is made with a pattern size greater than 0.5 µm, for example, to avoid excessively small pattern size before the heat flow. The positive type patterns 51 and 53 having a plurality of lines and spaces of the same dimension are provided inside and outside the pattern 52, respectively. The spaces have widths greater than twice those of lines so as to obtain a stable resist form after heat flow.

In measurement of the preceding positive type box pattern and a plurality of the present positive type patterns, edges of the line patterns symmetrical with respect to the section A-A' are measured to obtain pictures thereof. The pictures are waveform-treated to obtain the characteristic B-B'. The edges 10-1 and 10-2 of the line pattern are changed to the points 10-4 and 10-5 in the characteristic B-B', respectively. Consequently, the line pattern 10 at the secti⊙n A-A' including the edges 10-1 and 10-2 has a characteristic that the concentration value thereof increases linearly up to the central point 10-5 from the edge points 10-3 and 10-4.

Similarly, the measurement pattern 52 at the section A-A' including the edges 52-1 and 52-2 has a characteristic that the concentration value thereof increases linearly up to the point 52-5 from the edge points 52-3 and 52-4. The points 10-5 and 52-5 represent the concentration values of the central points of the respective line patterns.

The alignment measurement is performed at least at one point, for example, the interval between the points 10-5 and 52-5 is measured. In FIG. 3, two points are measured as shown by the arrows Z. It is not necessary to make measurements on both X and Y directions for each measurement point but any combination of the measurements is acceptable.

It is possible to prevent the position of the central point of the resist pattern for the alignment measurement from moving after the heat flow.

Fourth Embodiment

FIG. 4 shows a resist pattern (negative type) according to the fourth embodiment of the invention. The fourth embodiment employs negative type patterns, while the third employs the positive type patterns. A plurality of negative type box patterns including auxiliary patterns are provided. The auxiliary patterns are made with a pattern size smaller than that of the measurement pattern. The space width is greater than twice the line width of the measurement pattern. The widths of mask size spaces at inside and outside, upper and lower sides, and left and right sides are all made equal.

The form of the resist pattern after the heat flow is so symmetric that the position of the central point of the measurement pattern is unchanged after the heat flow treatment. The waveform treatment of the characteristic B-B' of the negative type pattern at the section A-A' is a reverse of the characteristic B-B' of the positive type pattern. The alignment measurement is performed in the same way.

The fourth embodiment has the same effects as those of the third embodiment. That is, it is possible to prevent the position of the central point of the resist pattern for alignment measurement from being changed by the heat flow treatment.

Fifth Embodiment

The fifth embodiment comprises positive type or negative type auxiliary patterns, such as, slits or lines patterns, while the third and fourth embodiments comprise box patterns as the auxiliary patterns. The slit patterns are provided to adjust the amount of resist which flows in or out so as to make accurate alignment measurement of the measurement pattern after the heat flow. An example of the positive type pattern is described below.

Figure 5:
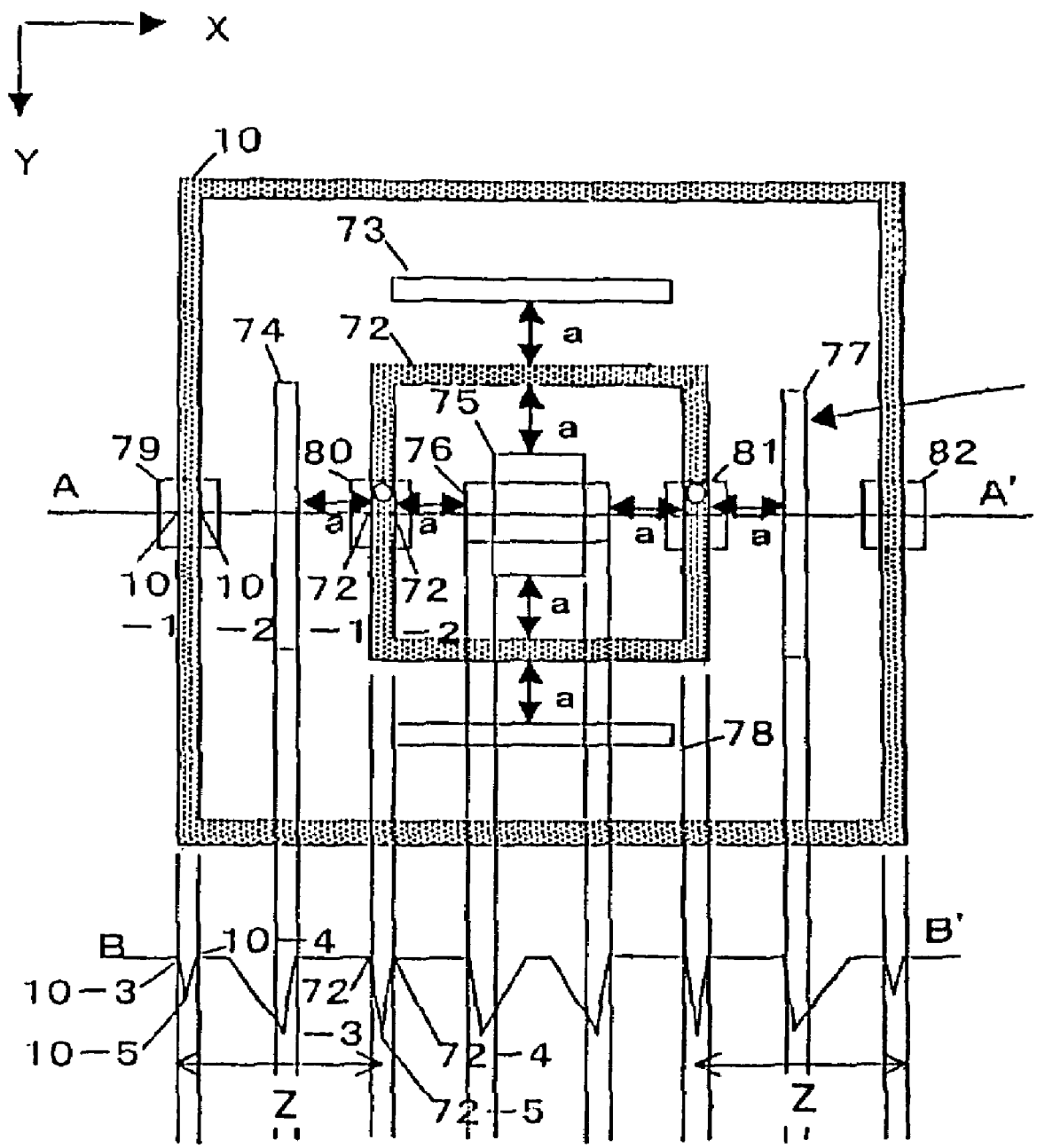
FIG. 5 is a plan view of a resist pattern (positive type) according to the fifth embodiment of the invention.

FIG. 5 shows a positive type resist pattern according to the fifth embodiment. A measured box pattern 72 having a similar shape as that of the preceding box pattern 10 is provided inside the preceding box pattern 10. Slit patterns 73, 74, 77, and 78 are provided in a space between the preceding box pattern 10 and the measured box pattern 72 in parallel with sides of the respective box patterns 10 and 72. An auxiliary pattern formed of two slit patterns 75 and 76 crossing each other is provided inside the measurement pattern 72.

The auxiliary patterns 73, 74, 77, 78, 75, and 76 may be line patterns instead of slit patterns. The auxiliary patterns 73-78 and the measurement pattern 72 are positive types. However, the above patterns may be made negative types.

(Measuring Operation)

The slit patterns 73-76 are provided inside and outside the positive type measurement pattern 72 as auxiliary patterns. These auxiliary patterns 73-76 are made with a pattern size smaller than that of the measurement pattern 72. A space width is made greater than twice the line width of the measurement pattern 72. Widths of the mask size space at inside and outside, upper and lower sides, left and right sides are all equal.

In FIG. 5, photo sensors 79, 80, 81, and 82 are arranged along the section A-A'. Edges of line patterns at the section A-A' are measured by the photo sensors 79-82 so as to obtain pictures of the line patterns. The detected pictures are changed to the characteristic B-B' by the waveform treatment. In the characteristic B-B', the concentration value decreases in accordance with the transparency rate of the positive type patterns. The edges 10-1 and 10-2 of the line pattern become the points 10-3 and 10-4 in the characteristic B-B' by the waveform treatment. Consequently, the line pattern including the edges 10-1 and 10-2 at the section A-A' has a characteristic that the concentration value thereof increases linearly up to the central point 10-5 from the edge points 10-3 and 10-4.

Similarly, the measurement pattern 72 at the section A-A' including the edges 72-1 and 72-2 has a characteristic that the concentration value thereof increases linearly up to the point 72-5 from the edge points 72-3 and 72-4. The points 10-5 and 72-5 represent the concentration values of the central points of the respective line patterns.

The alignment measurement is performed at least at one point, for example, an interval between the 10-5 and 72-5 is measured. In FIG. 5, two points are measured as shown by the arrows Z. It is not necessary to make measurements in both X and Y directions at each measurement point but any combination of the measurements is acceptable.

In FIG. 5, the resist pattern form after the heat flow treatment is symmetric. Accordingly, the position of the central point of the measurement patterns is not changed by the heat flow treatment so that the edge shape of the resist pattern is not changed after the heat flow treatment. The auxiliary pattern may be made with any pattern size as far as it is made smaller than the measurement pattern. However, if the auxiliary pattern is made excessively large, the increased amount of the flown-in resist deforms the auxiliary pattern.

Sixth Embodiment

Figure 6:
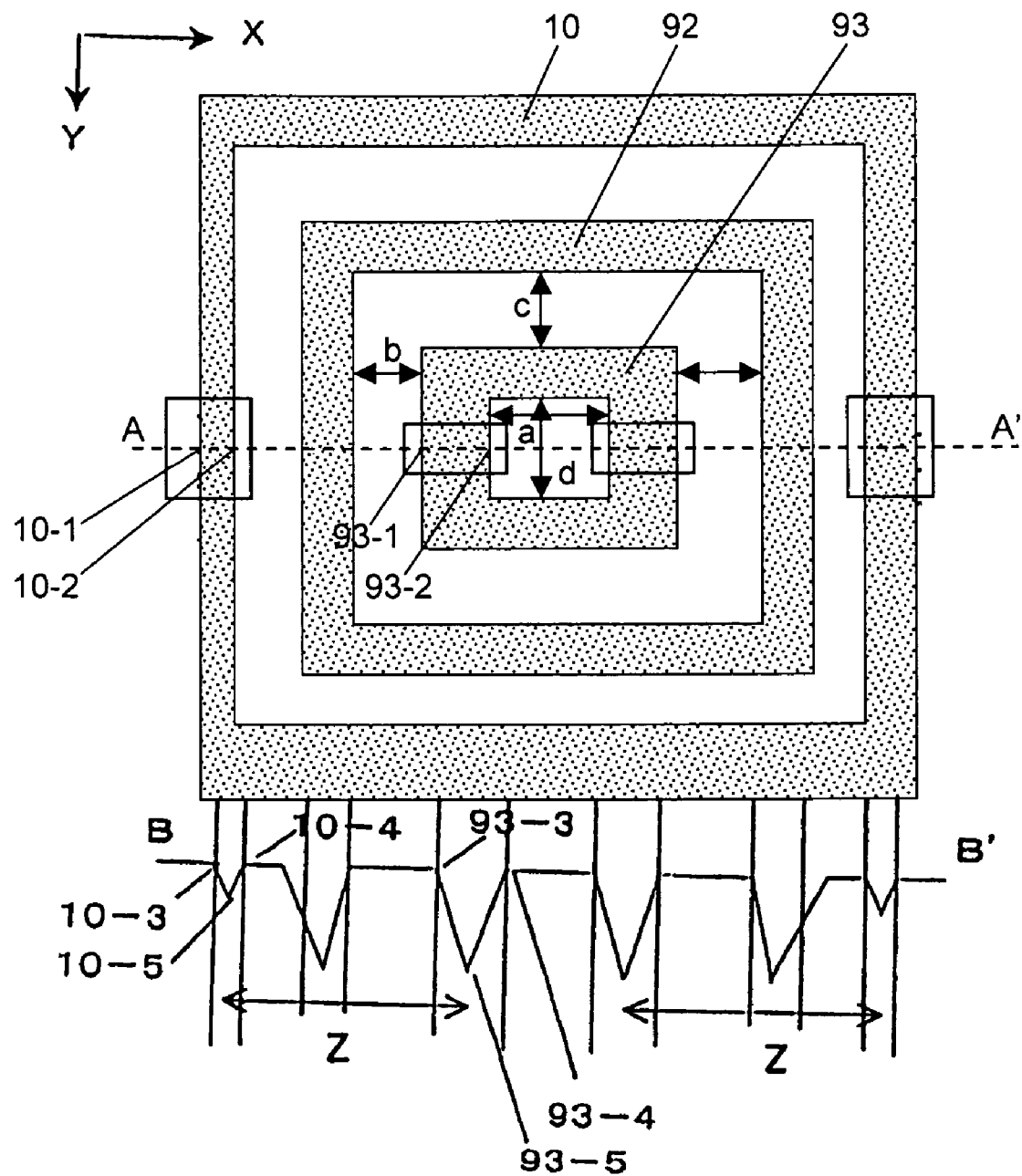
FIG. 6 is a plan view of a resist pattern (positive type) according to the first embodiment of the invention.

FIG. 6 shows a resist pattern (positive type) according to the sixth embodiment. In the sixth embodiment, an auxiliary pattern is not larger than a measurement pattern. The preceding pattern 10 is provided at the outermost position. Box patterns 92 and 93 having a similar shape as that of the preceding pattern 10 are provided inside the preceding pattern 10 at a predetermined interval. The box patterns 92 and 93 are spaced from each other with a predetermined space width. The space width is set larger than twice the line width of sides of the box patterns. The box pattern 92 is an auxiliary pattern, while the box pattern 93 is a measurement pattern.

The auxiliary pattern 92 is provided outside the positive type measurement pattern 93. The auxiliary pattern 92 is made with a pattern size smaller than that of the measurement pattern 93. Space widths of mask size at inside and outside, upper and lower sides, and left and right sides are all made equal. Photo sensors for recognizing a picture of the measurement pattern are arranged, for example, along the section A-A'. In FIG. 6, photo sensors 54, 55, 56, and 57 are arranged along the section A-A'.

Negative type patterns, which are made with a pattern size greater than 0.5 µm, for example, to avoid excessively small pattern size and include a plurality of lines having the same size and spaces of the same size, are provided. The spaces have a width greater than twice that of lines so as to obtain a stable resist form after the heat flow.

An inside opening of the measurement pattern 93 has a vertical dimension of d and a horizontal dimension of a. Vertical and horizontal distances between an outer edge of measurement pattern 93 and an inner edge of the auxiliary pattern 92 are c and d, respectively.

If the patterns are disposed such that the formula a=b=c=d is maintained, it is sufficient that one auxiliary pattern is provided inside or outside the measurement pattern. The formula a=b=c=d means that left and right sides are symmetric. The pattern according to the sixth embodiment may be made a negative pattern instead of a positive pattern.

In the same way as that of the preceding embodiments, the preceding pattern 10 and the present positive type pattern 93 become the characteristic B-B'. The box pattern 92 is an auxiliary pattern. That is, the edges 10-1 and 10-2 of the line pattern 10 becomes the points 10-3 and 10-4 in the characteristic B-B', respectively. Consequently, the line pattern 10 at the section A-A' after the waveform treatment has a characteristic that the concentration value increases linearly up to the central point 10-5 from the points 10-3 and 10-4.

Similarly, the box pattern 93 including edges 93-1 and 93-2 at the section A-A' has a characteristic, after the waveform treatment, that the concentration value increases linearly up to a central point 93-5 from points 93-3 and 93-4. The points 10-5 and 93-5 represent the concentration value of the central position of the respective line patterns.

The alignment measurement is performed at least at one place, for example, an interval between the points 10-5 and 93-5. In FIG. 6, two places are measured as shown by the arrows Z. It is not always necessary to measure in both X and Y directions at each measurement place but any combination of measurements is acceptable.

The positions of the central points of the patterns are not changed by the heat flow treatment because the shapes of the patterns are symmetric even after the heat flow treatment. Also, the number of the auxiliary patterns can be reduced.

Other Embodiments

In the above-mentioned embodiments, the invention is applied to the resist pattern for the alignment measurement. However, the invention is applicable to a resist pattern for improving the detection accuracy for an alignment mark or positioning mark in other semiconductor manufacturing apparatus.

According to the invention, a resist pattern for alignment measurement remains symmetric in the picture treatment signal of pattern edges even after the heat flow treatment. Also, the resist pattern has a stable shape after the heat flow treatment.

What is claimed is:

1. A method of measuring alignment of a measurement pattern relative to a first pattern formed on a semiconductor substrate in a first pattern forming process, comprising the steps of:
   forming a plurality of line patterns including the measurement pattern on the semiconductor substrate and a first auxiliary pattern arranged along the measurement pattern with a first distance therebetween after the first pattern forming process;
   applying heat to the measurement pattern and the first auxiliary pattern; and
   measuring a second distance between the first pattern and the measurement pattern to determine the alignment of the measurement pattern.

2. The method of measuring alignment according to claim 1, wherein, in the step of forming the plurality of line patterns, said first auxiliary pattern is disposed between the first pattern and the measurement pattern.

3. The method of measuring alignment according to claim 1, further comprising the steps of forming a second auxiliary pattern on a side opposite to that of the first auxiliary pattern relative to the measurement pattern, and applying heat to the second auxiliary pattern together with the measurement pattern and the first auxiliary pattern.

4. The method of measuring alignment according to claim 1, wherein, in the step of forming the plurality of line patterns, said first auxiliary pattern is formed away from the measurement pattern such that the first distance becomes greater than double of a width of the measurement pattern.

5. The method of measuring alignment according to claim 1, wherein, in the steps of forming the plurality of line patterns, said measurement pattern and said first auxiliary pattern are at least one of a positive type and a negative type.

6. The method of measuring alignment according to claim 3, wherein, in the steps of forming the second auxiliary pattern, said second auxiliary pattern is at least one of a positive type and a negative type.

7. The method of measuring alignment according to claim 1, wherein, in the step of forming the plurality of line patterns, said measurement pattern has a box shape.

8. The method of measuring alignment according to claim 1, wherein, in the step of forming the plurality of line patterns, said first auxiliary pattern has a box shape.

9. The method of measuring alignment according to claim 2, wherein, in the step of forming the second auxiliary pattern, said second auxiliary pattern has a box shape.

10. The method of measuring alignment according to claim 1, wherein, in the step of forming the plurality of line patterns, said first auxiliary pattern is formed of a slit.

11. The method of measuring alignment according to claim 3, wherein, in the step of forming the second auxiliary pattern, said second auxiliary pattern is formed of a slit.

* * * * *